(12) United States Patent
Jonsson et al.

(10) Patent No.: US 8,138,626 B2
(45) Date of Patent: Mar. 20, 2012

(54) POWER NODE FOR ENERGY MANAGEMENT

(75) Inventors: Karl S. Jonsson, Rancho Santa Margarita, CA (US); William Diehl, Dove Canyon, CA (US); Timothy Lyons, Tustin, CA (US); Martin Manniche, Laguna Hills, CA (US); Sonny Windstrup, Copenhagen (DK)

(73) Assignee: Greenwave Reality, PTE Ltd., Singapore (SG)

( * ) Notice: Subject to any disclaimer, the term of this patent is extended or adjusted under 35 U.S.C. 154(b) by 136 days.

(21) Appl. No.: 12/777,229

(22) Filed: May 10, 2010

(65) Prior Publication Data

US 2011/0095608 A1 Apr. 28, 2011

Related U.S. Application Data

(60) Provisional application No. 61/254,709, filed on Oct. 25, 2009, provisional application No. 61/261,707, filed on Nov. 16, 2009.

(51) Int. Cl.
*H02J 3/14* (2006.01)

(52) U.S. Cl. .......................................... 307/38
(58) Field of Classification Search .................. 307/39, 307/11
See application file for complete search history.

(56) References Cited

U.S. PATENT DOCUMENTS

| | | | |
|---|---|---|---|
| 4,858,141 A | 8/1989 | Hart et al. | |
| 5,258,656 A | 11/1993 | Pawlick | |
| 5,301,122 A | 4/1994 | Halpern | |
| 5,483,153 A | 1/1996 | Leeb et al. | |
| 5,650,771 A | 7/1997 | Lee | |
| 5,717,325 A | 2/1998 | Leeb et al. | |
| 5,754,963 A | 5/1998 | Nunneley et al. | |
| 6,476,729 B1 * | 11/2002 | Liu | 340/870.11 |
| 6,492,897 B1 | 12/2002 | Mowery | |
| 6,891,478 B2 | 5/2005 | Gardner | |
| 6,987,444 B2 | 1/2006 | Bub et al. | |
| 6,993,417 B2 | 1/2006 | Osann, Jr. | |
| 7,579,711 B2 * | 8/2009 | Menas et al. | 307/11 |
| 7,772,718 B2 | 8/2010 | Lee et al. | |
| 7,885,917 B2 | 2/2011 | Kuhns et al. | |
| 7,961,111 B2 * | 6/2011 | Tinaphong et al. | 340/638 |
| 7,970,542 B2 | 6/2011 | Bent et al. | |
| 8,013,545 B2 | 9/2011 | Jonsson | |
| 2003/0050737 A1 | 3/2003 | Osann | |
| 2004/0175078 A1 | 9/2004 | Imamura | |
| 2006/0202557 A1 | 9/2006 | Menas et al. | |
| 2006/0271544 A1 | 11/2006 | Devarakonda et al. | |

(Continued)

FOREIGN PATENT DOCUMENTS

KR 101-2009-0095689 A 9/2009

OTHER PUBLICATIONS

James Turner, "The Smart Power Strip," IEEE Spectrum, Mar. 2010, pp. 22-25, IEEE, United States of America. (Web version URL http://spectrum.ieee.org/geek-life/hands-on/the-smart-power-strip viewed May 10, 2010.).

(Continued)

*Primary Examiner* — Michael Rutland Wallis

(74) *Attorney, Agent, or Firm* — Bruce A. Young

(57) ABSTRACT

A power node provides energy management features in a networked data communications and control environment.

17 Claims, 11 Drawing Sheets

U.S. PATENT DOCUMENTS

| | | |
|---|---|---|
| 2007/0041340 A1 | 2/2007 | Binder |
| 2007/0135973 A1 | 6/2007 | Petite |
| 2007/0297112 A1 | 12/2007 | Gilbert |
| 2008/0094210 A1 | 4/2008 | Paradiso et al. |
| 2009/0059602 A1 | 3/2009 | Recker et al. |
| 2009/0207034 A1 | 8/2009 | Tinaphong et al. |
| 2009/0234512 A1 | 9/2009 | Ewing et al. |
| 2009/0236909 A1 | 9/2009 | Aldag et al. |
| 2009/0322159 A1 | 12/2009 | DuBose et al. |
| 2010/0005331 A1 | 1/2010 | Somasundaram et al. |
| 2010/0084992 A1 | 4/2010 | Valois et al. |
| 2010/0090542 A1 | 4/2010 | Johnson et al. |
| 2010/0141153 A1 | 6/2010 | Recker et al. |
| 2010/0145542 A1 | 6/2010 | Chapel et al. |
| 2010/0191487 A1 | 7/2010 | Rada et al. |
| 2011/0031819 A1 | 2/2011 | Gunwall |
| 2011/0062874 A1 | 3/2011 | Knapp |
| 2011/0098867 A1 | 4/2011 | Jonsson et al. |

OTHER PUBLICATIONS

Hart, G. W., Nonintrusive appliance load monitoring, Porceedings of the IEEE, vol. 80, No. 12, Dec. 1, 1992, pp. 1870-1891, IEEE, New York, NY, US.

Notice of Allowance for U.S. Appl. No. 12/795,395, USPTO, Jul. 22, 2011.

A. Pudenzi, A Neuron Nets Based Procedure for Identifying Domestic Appliances Pattern of Use from Energy Recordings at Meter Panel, IEEE, 2002.

Non-Final Office Action for U.S. Appl. No. 12/795,629, USPTO, Oct. 24, 2011.

* cited by examiner

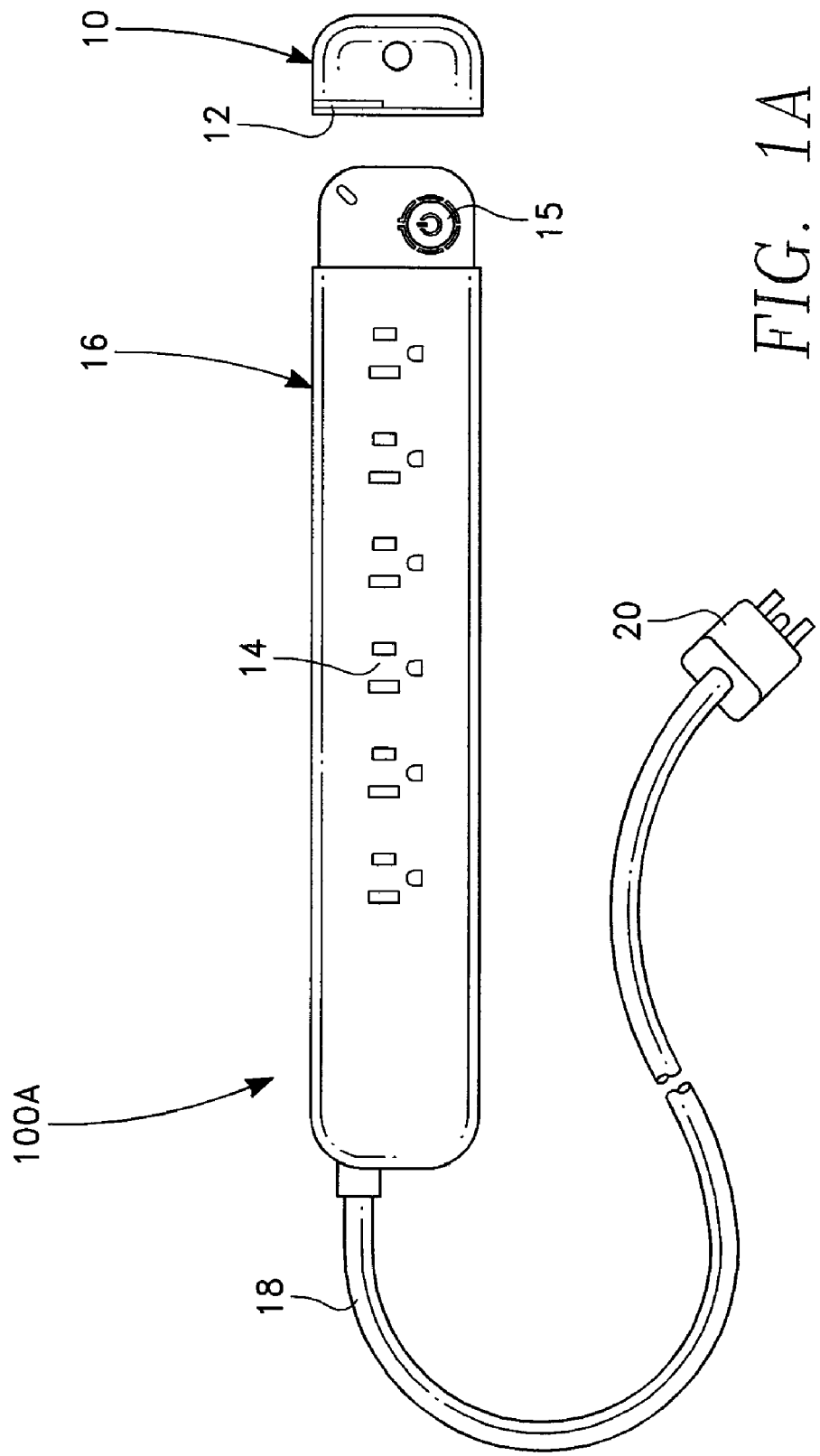

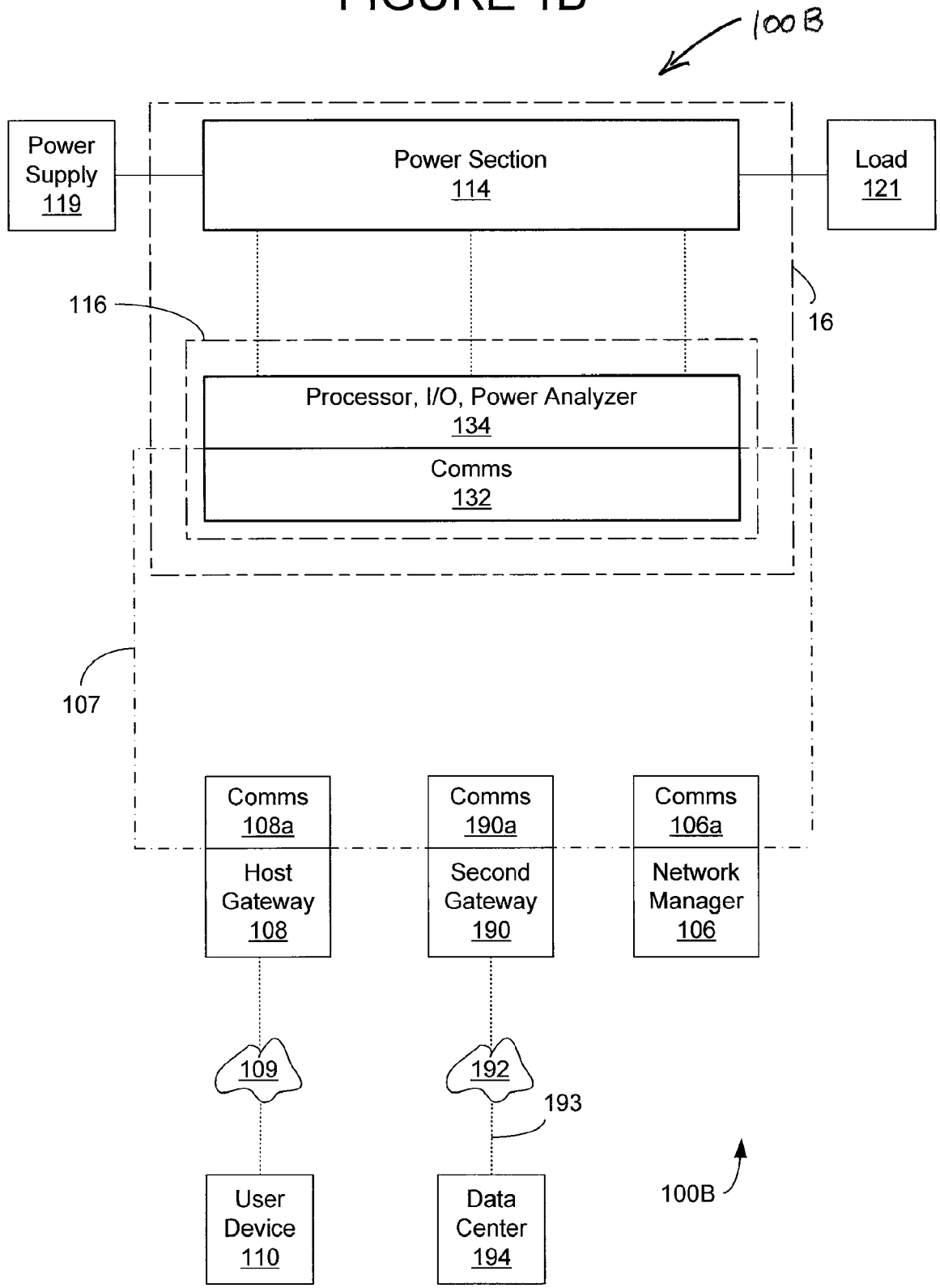

FIGURE 7

| Measurements | | | Analysis | | |
|---|---|---|---|---|---|
| Device | Inputs | Outputs | Basic Analysis | Intermediate Analysis | Advanced Analysis |
| 1. Power Analyzer | a) Instantaneous voltage from voltage transducer<br><br>b) Instantaneous current from current transducer<br><br>c) Temperature from temperature transducer | Voltage<br>-instantaneous<br>-RMS<br><br>Current<br>-instantaneous<br>-RMS<br><br>Power<br>-real<br>-apparent<br>-reactive<br>-fundamental<br><br>Temperature | Current<br>-peak v. RMS<br><br>Power Consumption<br>-standby<br>-operating<br>-power factor | Power Consumption Over Extended Time Interval<br>-frequency of use<br>-time duration of each use | Voltage<br>-cut off discharge<br><br>Current<br>-initial draw |
| 2. Insertion Switch | a) Plug insertion | Open/closed contact (plug inserted) | Plug Inserted | | |
| 3. Dial Selector | a) Switch position selection | Room Location<br><br>Neighbor Appliances<br><br>Time of use<br><br>Type of power strip (single outlet or multiple outlets) | Room Location<br><br>Neighbor Appliances<br><br>Time of use<br><br>Type of power strip (single outlet or multiple outlets) | | |

FIGURE 9

| Message Name | Definition | Utility |
|---|---|---|
| Instantaneous Power<br><br>On-demand current /power reading. | Instantaneous power readings transmitted on demand, in response to network query, or upon CDS event. | Used in generation of composite dashboard, overall household load, and breakdown of individual contributions. By use of CDS change-threshold detection polling can be eliminated and network traffic reduced. |
| Meter Report<br><br>Aggregate power consumption report. | Smart meter consumption reporting for individual socket(s) (voluntary/scheduled/on demand) | Conventional power consumption metering. Also, in addition to Z-wave standard smart meter class to implement efficient scheduling and automatically send pertinent consumption reports to gateway host. |
| Waveform Profiles<br><br>Includes v and i waveforms/profiles. Using secondary appliance load characteristic data from power analyzer | Sent from power strip to gateway host upon threshold events generated by power strip change detection system ("CDS.") | Waveform profiles are used to match loads with known appliances. In the datacenter, waveform profiles can be matched against a signature database and used as one indicator for device or device class identification. Waveform profiles can also be used for automation purposes in identification of internal appliance states. |
| OverCurrent Alert | Sent from power strip to gateway host upon signal from power node OverCurrent Protection System (OCPS). | Whenever an over current situation occurs, there may be short circuit hazards involved, or accidental misoperation. In either case, generating these over current alert messages on the network provides a means to inform users via a user device or via notice from the data center that remedial action should be taken. |
| CDS Filter Profile<br><br>Paramaters controlling change detection system filter behavior | Sent from gateway host to power strip to modify change detection filter properties for a single socket. | Filter profiles are used to fine tune the power strip hosted change detection system which limits network traffic to only significant or interesting traffic such as significant waveform profiles and significant power consumption. |

POWER NODE FOR ENERGY MANAGEMENT

PRIORITY CLAIM

This application claims the benefit of U.S. Prov. App. No. 61/254,709 filed Oct. 25, 2009 and U.S. Prov. App. No. 61/261,707 filed Nov. 16, 2009.

INCORPORATION BY REFERENCE

The disclosures of U.S. Prov. App. No. 61/254,709 filed Oct. 25, 2009 and U.S. Prov. App. No. 61/261,707 filed Nov. 16, 2009 are incorporated, in their entireties and for all purposes, herein by reference.

BACKGROUND OF THE INVENTION

1. Field of the Invention

The present invention relates to an electrical appliance. In particular, a power node provides energy management features in a networked data communications and control environment.

2. Discussion of the Related Art

Electric power strips typically have a plurality of electrical outlets mounted within an enclosure and an attached power cord for electrically interconnecting the outlets with an AC power source. While modern power strips may include overload protection and/or surge protection, they do not include signal and power electronics enabling the power strip to be incorporated into a networked energy management system.

SUMMARY OF THE INVENTION

A power node for energy management. In an embodiment, a power node or strip includes: One or more sockets, each socket operable to receive a plug for supplying power to a respective load; a power supply bus having one or more bus taps, each socket coupled to a respective power supply bus tap via an automated switch; a voltage sensor coupled to the power supply bus; one or more current sensors, each current sensor operable to sense the current supplied to a respective socket; a selector device operable by a power node user to select an environmental variable from a plurality of selectable environmental variables; a signal electronics section in signal communication with the selector device and the voltage and current transducers; the signal electronics section operable to monitor the current supplied to each load, monitor the voltage of the power supply bus, monitor the power supplied to each load, disconnect and reconnect individual loads, and communicate with a controller via a network; an enclosure and a power cord extending from the enclosure; the power cord having first and second ends, the first end terminated with a plug and the second end coupled to the power supply bus; and, the enclosure housing the socket(s), the automated switch (es), the power supply bus, the signal electronics section, and the current and voltage transducers.

In an embodiment, the power node includes: The enclosure having an air inlet and an air outlet with a natural draft flow path therebetween; a temperature sensor located near the air inlet; the temperature sensor in signal communication with the signal electronics section; and, the signal electronics section operable to monitor the air temperature in the vicinity of the power node.

In an embodiment, the power node includes: each socket having an associated insertion switch; an electrical state of the insertion switch operable to indicate whether a plug is inserted in the outlet; each insertion switch located within the enclosure and in signal communication with the signal electronics section; and, the signal electronics section operable to monitor the state of each insertion switch.

In an embodiment, an energy management system comprises: One or more of the power nodes described in paragraph 4 above; each power node signal electronics section having a communications block; a mesh network for transporting signals between the communications blocks and a gateway device; a user device in signal communication with the mesh network via the gateway device; and, the user device operable to control the power supplied to individual loads, limit the power consumed by individual loads to preselected values, aggregate and report on energy consumption, disconnect and reconnect individual loads according to a time schedule, and characterize the nature of a particular load based on the selected environmental variable and one or more power bus voltage measurements of the corresponding power node and based on one or more current measurements of the corresponding socket.

In an embodiment, a method of managing energy consumption comprising the steps of: interposing a plurality of power nodes for energy management in a plurality of power circuits supplying a plurality of appliances with electric power; measuring the energy consumption of each electric appliance; displaying to an energy user opportunities for reducing energy consumption, said opportunities being identified by the measurements of energy consumption; and, managing energy consumption by providing the energy user with an automated means to remotely control the energy consumption of each electric appliance.

In an embodiment, the method further comprising the steps of: identifying the standby consumption of each appliance; and providing a means for the energy user to automatically interrupt the power flow to any appliance in a standby mode for a time greater than a predetermined period of time.

BRIEF DESCRIPTION OF THE DRAWINGS

The present invention is described with reference to the accompanying figures. These figures, incorporated herein and forming part of the specification, illustrate embodiments of the invention and, together with the description, further serve to explain its principles enabling a person skilled in the relevant art to make and use the invention.

FIG. 1A shows a power node for energy management in accordance with the present invention.

FIG. 1B shows a schematic diagram of an energy management system including the power node of FIG. 1A.

FIG. 7 shows a table of measurements and analysis associated with use of the power node of FIG. 1A.

FIG. 9 shows a table of messages associated with the energy management system of FIG. 1B.

DETAILED DESCRIPTION OF THE PREFERRED EMBODIMENTS

Figure 2:
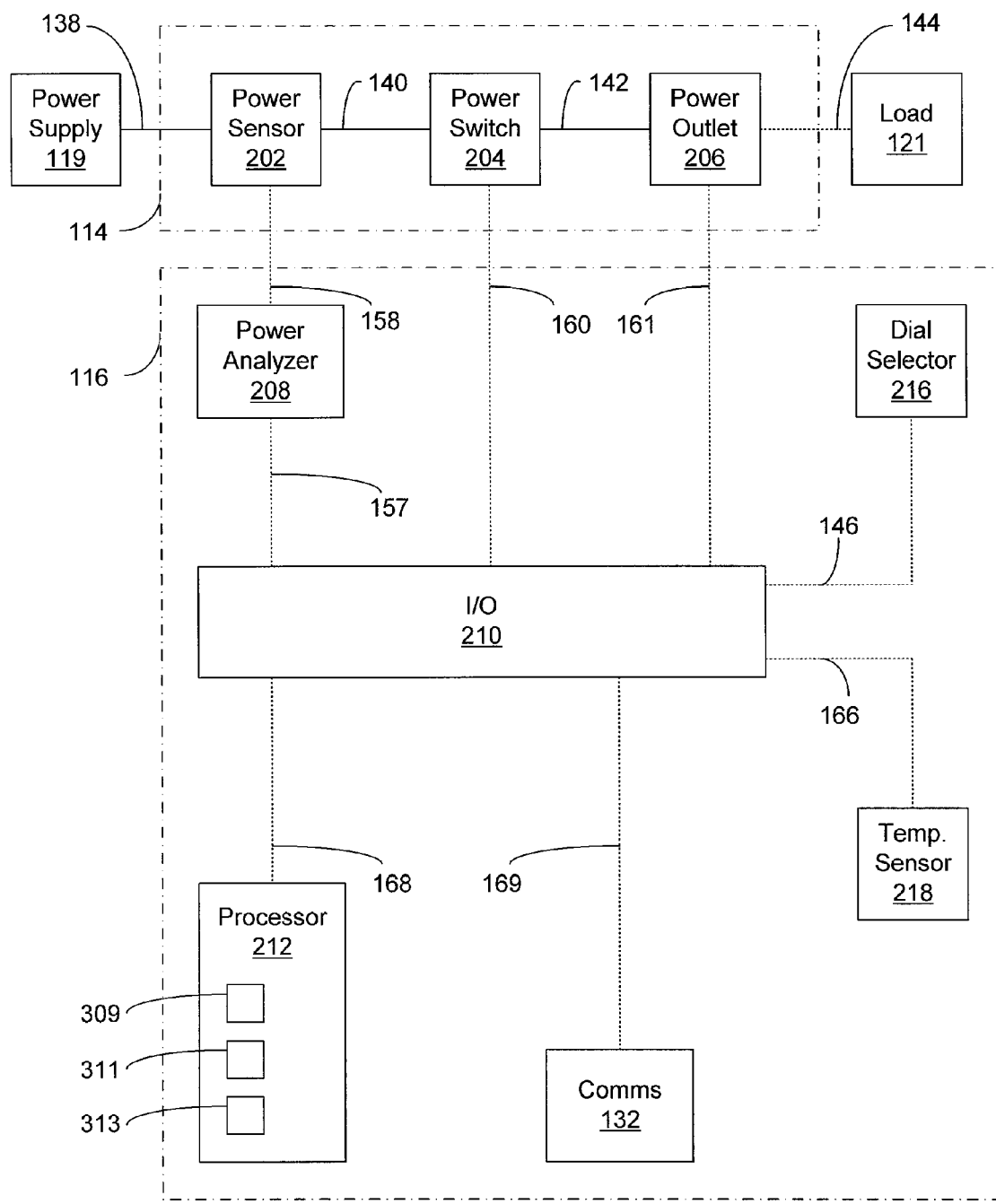
FIG. 2 shows a first schematic diagram of the power node of FIG. 1A.

The disclosure provided in the following pages describes examples of some embodiments of the invention. The designs, figures, and description are non-limiting examples of the embodiments they disclose. For example, other embodiments of the disclosed device and/or method may or may not include the features described herein. Moreover, disclosed advantages and benefits may apply to only certain embodiments of the invention and should not be used to limit the disclosed invention.

As used herein, the term "coupled" includes direct and indirect connections. Moreover, where first and second devices are coupled, interposed devices including active devices may be located therebetween.

FIG. 1A shows a power node in accordance with the present invention 100A. A power node housing or enclosure 10 includes one or more sockets or outlets 14 that are electrically coupled with a power node cord 18 that is typically terminated with a power plug 20. Accessible to the power node user is an on button 15 and a dial selector 12. Within the power node housing are power and signal electronics 16 discussed more fully below.

FIG. 1B shows an exemplary networked power node 100B. In an embodiment, one or more power nodes 100A include respective power 114 and signal 116 electronics sections (electronics for one power node shown). Within the signal electronics section 116 is a communications and control means 132 for exchanging data with a local network 107. The network may be any suitable network known to persons of ordinary skill in the art including; wired, such as Ethernet or other IEEE 802 wired standards; wireless, such as 802.11 a/b/g/n or other IEEE 802 wireless standards, or Zigbee, or Z-Wave; or, power line communications, such as INSTEON® and X10 networks. In one embodiment a Zigbee mesh network is used. And, in one embodiment a Z-Wave mesh network is used.

In some embodiments, the communications means 132 includes a power line communications ("PLC") device such as a PLC modem for communicating with a gateway 108a, 190a that is also equipped with a PLC device, the two PLC devices being coupled for communication via electric power lines such as the electrical wiring of a building or structure. In an embodiment, an Ethernet switch in the power node 100A is coupled to the power node PLC and provides one or more Ethernet connections such as an Ethernet connection enabling functions of the power node and an Ethernet connection available to devices external to the power node.

In various embodiments, a networked power node 100A utilizes the network to communicate with other devices. For example, a host gateway device 108 having a means for communicating with the network 108a can transmit commands to or receive data from a power node 100A. In this embodiment, a user device and/or processor 110 with a connection to the gateway 109, such as a controller, a special purpose controller, a personal computer, or a special purpose computer, is capable of issuing commands to or receiving data from a power node via the local network 107. In some embodiments, the host gateway includes one or more of the user device functions. Connections between the user device and the gateway 109 can use any suitable wired or wireless connection including the network connection types mentioned above.

A gateway 108 is configured in various embodiments to handle known TCP/IP based devices utilizing, for example, an IP based API available from the gateway. In an embodiment, the gateway uses a simple SSDP discovery daemon allowing IP devices on the network 107 to find it. Typical TCP/IP devices include one or more of an iPhone®, iPad, iPod®, network connected tablet, TV, bluray player, and the like.

In some networked embodiments a network management device 106 having a means for communicating with the network 106a, such as a network coordinator or network controller, is included for implementing network management functions. Network management functions can include, among other things, maintaining a list of interconnected devices and maintaining routing tables. In particular, network coordinators are used with Zigbee networks and controllers are used with Z-Wave networks. Network management devices may supplement and/or duplicate the functionality provided by gateway device(s) 108 and their interconnected user devices 110.

And, in some networked embodiments, a second gateway 190 with second gateway communications block 190a and second gateway connection 192 interconnects via an external network 193 with a data center 194 (as shown). In other embodiments, the datacenter external network communicates via the host gateway connection 109.

In an exemplary system including one or more power nodes 100A, a host gateway 108 and a user device 110, each of these devices includes memory for storing a device identification code. Device identification codes enable messages to be routed to the correct device. In an embodiment, a common group or home identification code is used to enable communication among members of the group.

FIG. 2 shows exemplary power node electronics 200. As described above, the power node 100A includes a signal electronics section 116 and a power electronics section 114.

Signal electronics include an input/output ("I/O") block 210 coupled to each of a processor and memory block 212, and a communications block 132. In various embodiments, one or more of a power analyzer block 208, a dial selector block 216 and a temperature sensor block 218 are coupled to the I/O block. And, in some embodiments, an Ethernet switch is included in the communications block 132 or in addition to the communications block 132.

In various embodiments of the signal electronics section 114, a wireless module such as a Z-Wave or Zigbee module is used to implement the I/O block 210, processor block 212, and communications block 132. For example, a Sigma Designs ZM3102 Z-wave module is used in one embodiment and a ZigBEE chipset is used in another embodiment. In some embodiments, the input/output functionality is enhanced with a general purpose I/O expander integrated circuit such as an NXP PCA9534BS 8-bit I2C-bus and SMBus low power I/O port with interrupt.

In an embodiment, a metering system 309 is implemented in the processor 212. The metering system totalizes power consumption for each outlet 206 to produce a meter report. In some embodiments an over current protection system ("OCPS") 313 is implemented in the processor. The over current protection system compares measured current for each socket 206 and for all sockets against safety limits and disconnects offending appliances in case of excess loads. And, in some embodiments a change detection system ("CDS") 311 is implemented in the processor. These systems are discussed more fully below.

In an embodiment, a power/energy integrated circuit such as a Cirrus Logic CS 5463 integrated circuit is used to implement the power analysis functionality of the power analyzer block 208. Power consumption and other data available from the power analysis device includes one or more of real/active power, RMS values of current and voltage, apparent power, reactive power, fundamental power, and temperature sensing. As will be understood by persons of ordinary skill in the art, waveform profiles of one or more of voltage, current, and power can be constructed by any processor in signal communication with the I/O block.

The power section 114 includes a power sensor block 202, a power switch block 204, and a power outlet block 206. The power sensor block is coupled to a power source 119 via a first power circuit 138. The switch block 204 is coupled to the power sensor block via a second power circuit 140 and to an outlet 206 via a third power circuit 142. A load 121 is coupled to the outlet via a fourth power circuit 144.

The power analyzer is coupled to the power sensor block 202 via a signal line 158 and to the I/O block via a signal line 157. Switch block 204 is coupled to the I/O block by a signal line 160. Outlet block 206 is coupled to the I/O block via a signal line 161.

The processor block is coupled to the I/O block 210 via a signal line 168. Where used, dial selector block 216 is coupled to the I/O block via a signal line 146 and temperature sensor block 218 is coupled to the I/O block via a signal line 166. The communications block is coupled to the I/O block via a communications a signal line 169.

Figure 3:
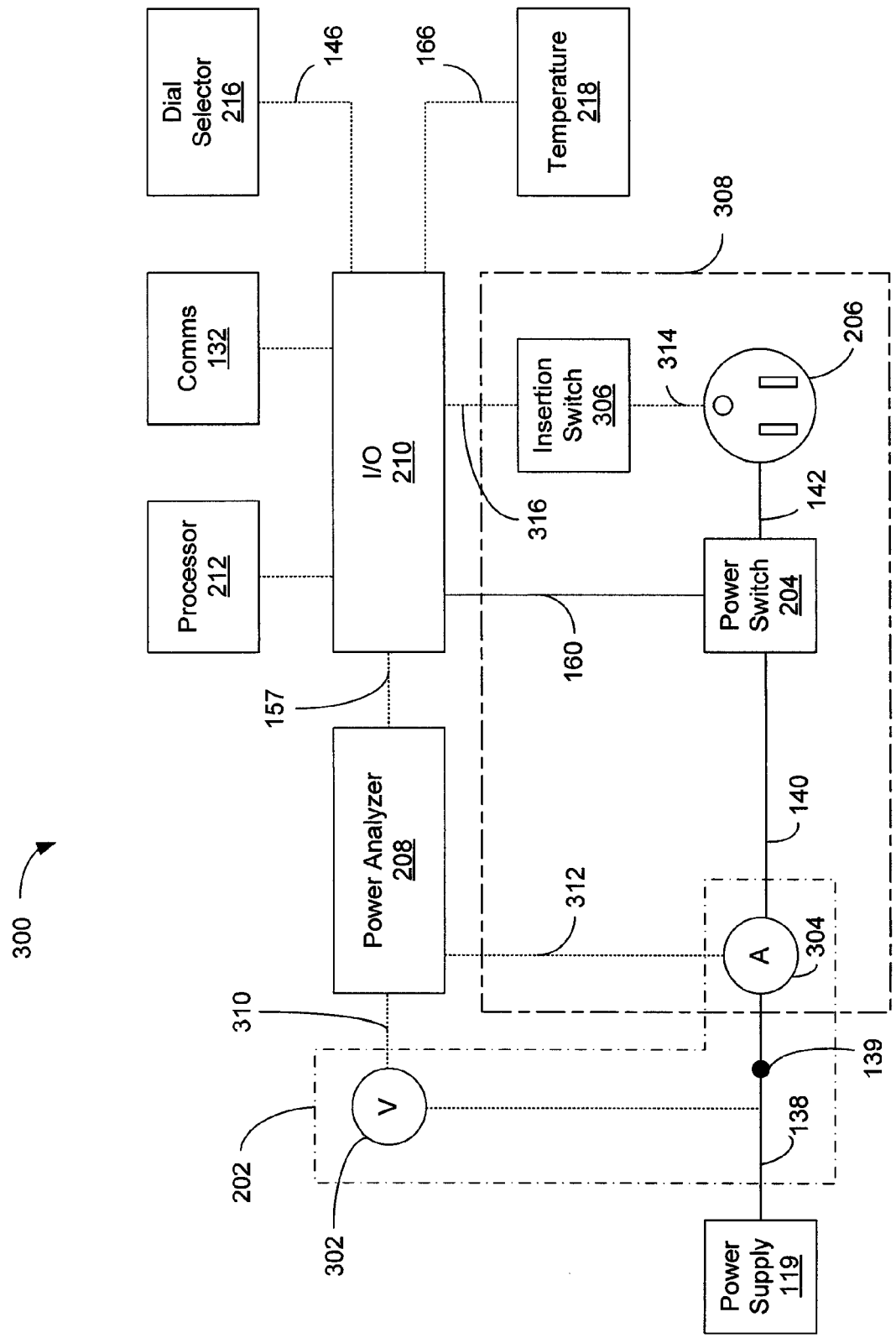
FIG. 3 shows a second schematic diagram of the power node of FIG. 1A.

FIG. 3 shows a power node having a single outlet 300. This single outlet embodiment provides a single power channel 308 including an outlet 206, a power switch 204 and a current transducer 304. The power channel receives electric power via a bus tap 139 on a power bus 138. In other embodiments, a plurality of power channels provide respective outlets in multi-outlet power nodes.

Power supplied to the outlet 206 is sensed by a power bus voltage transducer 302 and the power channel current transducer 304, together the power sensor block 202. Voltage and current transducer output signal lines 310, 312 are coupled to the power analyzer block 208 which is coupled to the I/O block 208. In some embodiments, voltage is measured at a gateway 108, 190 rather than at individual power nodes 100A.

In an embodiment, a voltage transducer 302 measures the power node bus voltage. Here, the power supplied to each outlet is known since outlet voltage and respective outlet currents are known. Further, the power being supplied to the power node 100A from the power supply 119 is approximately equal to the power drawn by all of the power node outlets and is also know.

In some embodiments, the voltage at each outlet is monitored by a respective voltage transducer located between the outlet and the power switch 204. This embodiment provides for, inter alia, measuring a load's voltage decay after the power switch is opened.

Interposed between the power supply 119 and the outlet 206 is a power switch 204. A power switch signal line 160 couples the I/O block 210 with the power switch. The switch may be any switch known in the art that allows for automated control, such as a mechanical or solid state relay, or a semiconductor switch. In one embodiment a latching type relay is used and in another embodiment a TRIAC type switch is be used.

The outlet 206 is coupled to a power output of the power switch 204 via the third power circuit 142. In some embodiments, an insertion switch 306 senses 314 whether a plug is inserted in the outlet 206 and provides an insertion signal to the I/O block 316.

In an embodiment, consumption of each connected load or appliance 121 is monitored during appliance standby periods such that standby power consumption is measured. Typically, an appliance's standby power level is the lowest non-zero power level associated with the appliance. Here, gateway and/or user device 108, 110 selections enable the user to interrupt power flow to an appliance in a standby mode. In some embodiments, the user can define a standby time period which, if exceeded, automatically opens the associated power switch 204 to interrupt the appliance standby power flow.

Plug insertion sensing may be accomplished by any means/device known to persons of ordinary skill in the art. For example, various embodiments employ a capacitive sensor, an optical sensor, and a mechanical sensor. All of these devices are referred to herein as an "insertion switch."

Figure 4:
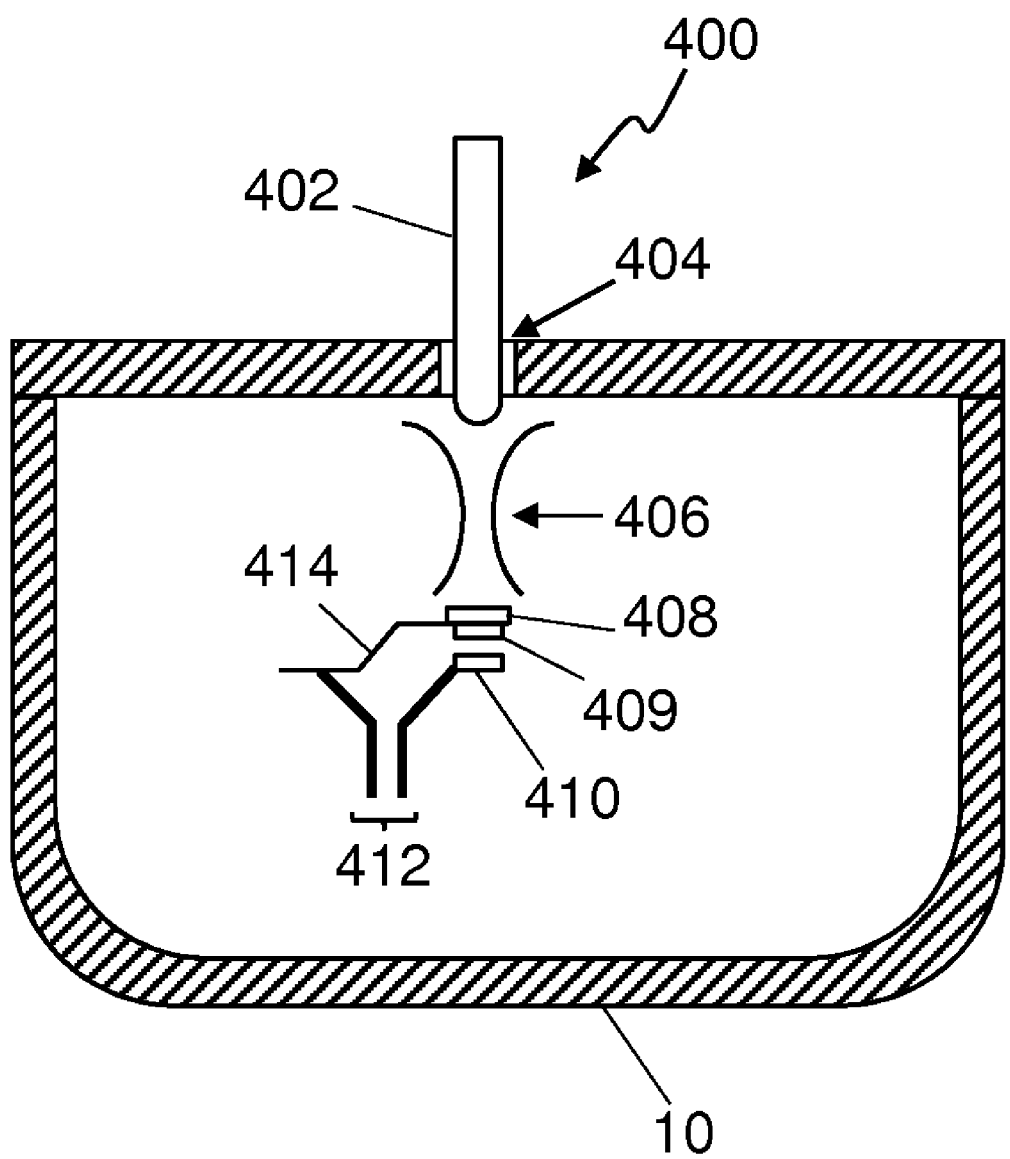
FIG. 4 shows a schematic diagram of an insertion switch of the power node of FIG. 1A.

FIG. 4 shows an electro-mechanical insertion switch 400. This switch utilizes a spring arm 414 that is depressed by a blade of a plug 402 when the blade is inserted in the outlet opening 404 and between spring contacts 406 of an outlet power circuit. The inserted blade contacts a pressure pad such as an insulator 408 at one end of the spring arm and pushes a moving contact 409 against a stationery contact 410 closing the circuit 412. The closed circuit is the signal that a plug is inserted in the outlet 206.

In some embodiments, a dial selector 216 is coupled to the I/O block 208. The dial selector provides a means for selecting an environmental variable through the use of symbols, letters, numbers, colors, or other indicia associated with dial selector positions. For example, one setting might be used for a power node located in a home theatre while another setting might be used for a power node located in a bedroom. Environmental variables are used in various embodiments to designate a particular room, a category of electrical loads such as a home theatre, a predefined scene such as conserve energy, a particular use such as entertainment, and a particular time or season such as winter.

Figure 5:
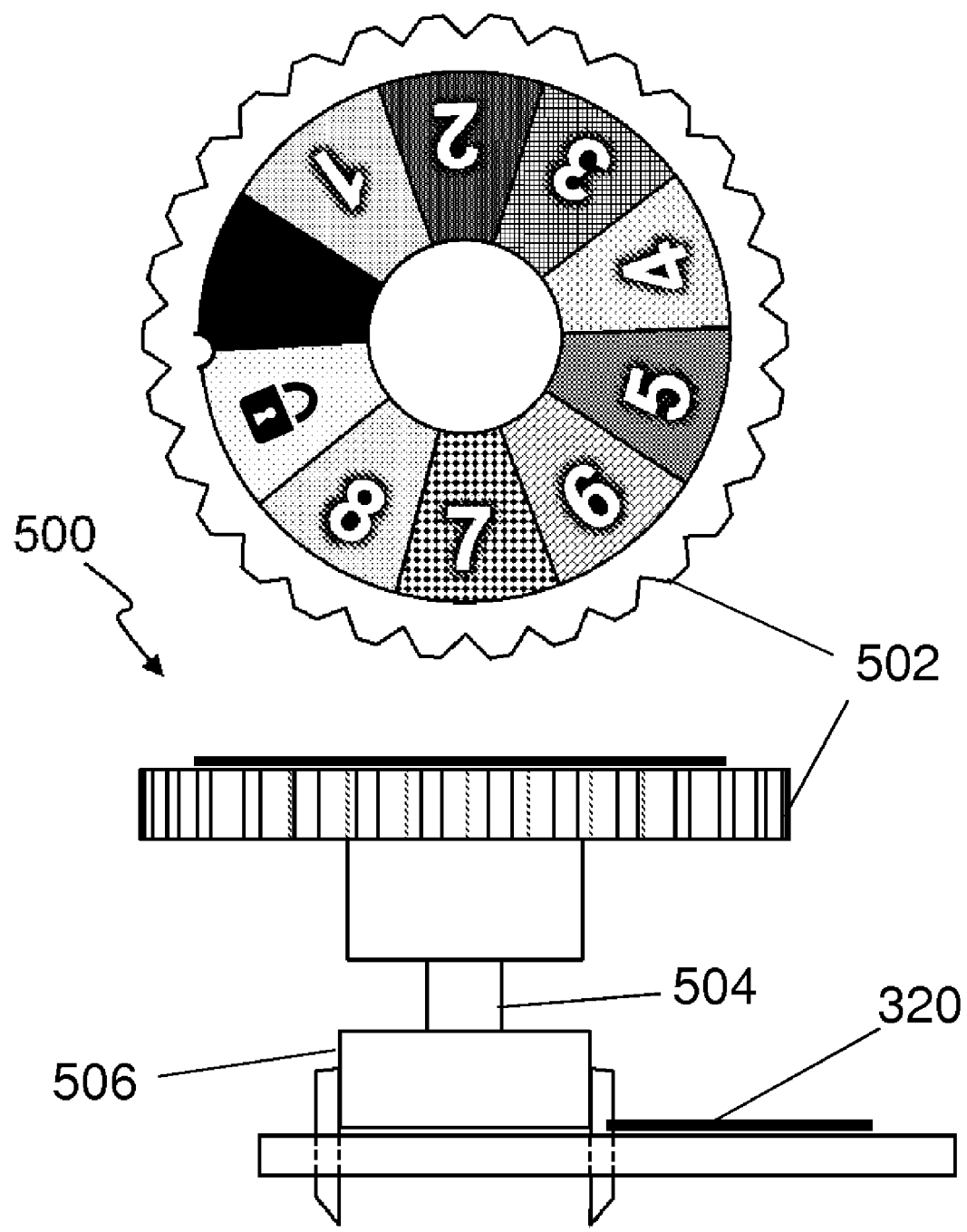
FIG. 5 shows a schematic diagram of a dial selector of the power node of FIG. 1A.

FIG. 5 shows one embodiment of a dial selector 500. A dial selector wheel 502 is used to rotate a shaft 504 that actuates a dial selector switch 506. Switch signals corresponding to selected states are coupled to the I/O block 208 via dial selector switch signal line 320. Any suitable switch known to persons of ordinary skill in the art may be used. Suitable switches include rotary and slider type switches and analog and digital switches. In an embodiment, a switch opens and closes circuits such as digital circuits corresponding to each switch position. In another embodiment, a binary coded decimal ("BCD") rotary switch is used. In yet another embodiment, an analog switch such as a potentiometer together with an analog to digital converter is used.

Where the dial selector 500 is used to designate location, an embodiment includes a multi-colored dial selector wheel 502 having eight colored segments arranged around the periphery of the wheel. In addition to the eight colored segments, black and white segments are included. Each segment corresponds to a switch 506 position. The colors indicate particular rooms or spaces within a home or another multi-space, multi-use environment such as an office suite or building. Black indicates a spare or user designated variable and white indicates a power node monitoring only state where control functions are disabled.

In some embodiments, a temperature transducer 218 is used to sense a temperature of the environment where the power node is located. Signals from the temperature transducer are coupled to the I/O block 208 via a temperature transducer signal line 322.

Figure 6:
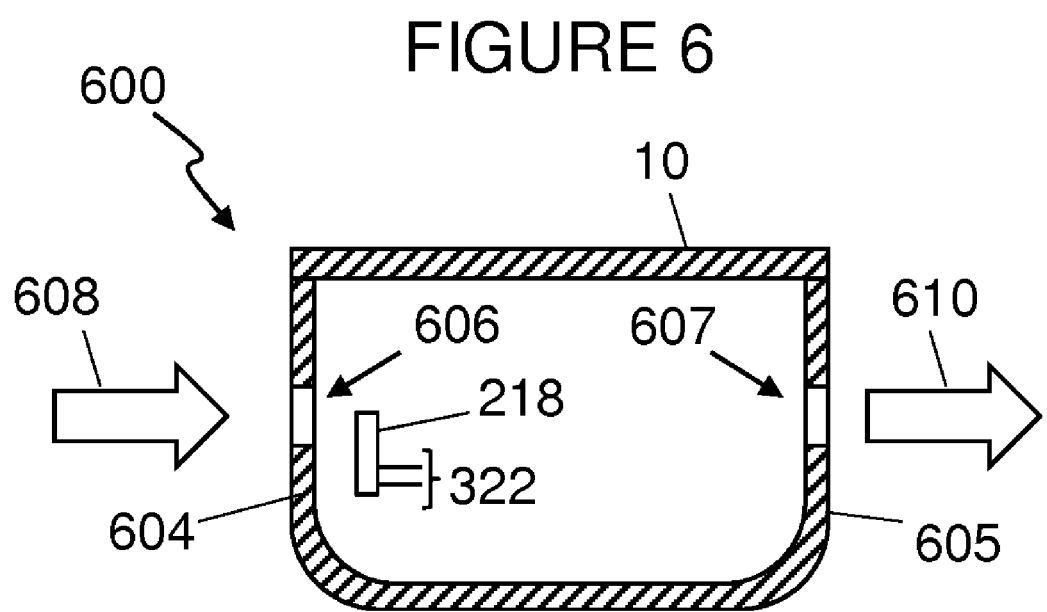
FIG. 6 shows a schematic diagram of a temperature transducer of the power node of FIG. 1A.

FIG. 6 shows one embodiment of a temperature transducer located in a power node housing 600. A first surface area of a power node housing 604 has an air inlet 606 and a second surface area of the power node housing 605 has an air exhaust 607. In various embodiments, the air inlet and exhaust are located to facilitate a natural draft 608, 610 through the power node housing such as a draft created by a heated electrical component. The temperature transducer 218 is located near the inlet and temperature transducer signals are coupled to the I/O block via a temperature transducer signal line 322.

In operation, the power node 100A is capable of supplying power to a load or, in embodiments with multiple power channels 308, to multiple loads. Load control including switching loads on and off is enabled by network communications 107 between a command issuing device such as a user device 110, network manager 106, or data center 194, and a command receiving device for a particular power node 132. For example, a command issued from the user device to turn a particular outlet on is routed via the network to a particular power node communications block 132. The power node processor 212 receives the command from the I/O block 210, interprets the command, and sends the power switch an on signal 204 via the I/O block and signal line 160.

Outlets 206 are capable of being turned on and off by direct commands from a user as described above. Outlets can also be turned on and off under program control. For example, under program control an outlet's state may be selected based on one or more of time, a selected load, energy pricing, power consumption during a particular period of time, environmental conditions, or other data available to a processor in signal communication with the power node I/O block 208.

Energy reporting and management functions are enabled by the bus voltage transducer 302, power channel current sensor 304, the outlet insertion switch 306, and the power node power analyzer 208. Power analyzer inputs include power node bus voltage sensed by the power node bus voltage transducer and outlet current(s) sensed for each power channel 308 by a respective power channel current transducer.

The power provided to each outlet 206 is know because the current supplied to each outlet is measured 304 and a single bus voltage that is common to all outlets is measured 302. From these measurements, the power analyzer 208 can send data to the I/O module 210 including instantaneous current and voltage. In various embodiments, the power analyzer can send additional data to the I/O module including one or more of real power, RMS voltage and current, apparent power, reactive power and fundamental power.

Data from the power analyzer 208 is available to any processor in signal communication with the I/O block 210. For example, a user device 110 can receive data from the power analyzer via the network 107. Instantaneous values, trends, and summaries of data are available from power analyzer data stored in the user device or another network accessible memory device, any of which can be reported to the user. In addition, outlet insertion switch 306 status is available to the I/O block, a first state indicating a plug is inserted in the outlet and a second state indicating no plug is inserted in the outlet.

In some embodiments, data from external sources, such as energy prices reported by an electric utility or electric system operator, are available whether manually entered or acquired from the network via a connection such as an internet connection via the data center 194 or an internet gateway. Using this electric rate/cost information and the electric consumption information, the user device is capable of reporting cost metrics such as instantaneous electric supply costs, summarized electric costs, period specific electric costs, and suggestions for lowering electric costs such as shifting electric loads to less costly times of the day.

In a power node with multiple outlets, a default mode designates one of the sockets 206 as a master socket. Depressing the power node on button 15 enables the master socket by closing the respective power switch 204. In the default mode, all power node sockets other than the master socket are slave sockets. If the master socket is supplying power to a load 121, the slave sockets are similarly enabled. If the master socket is not supplying power to a load, the slave sockets are disabled. Where interrelated components of a system such as an entertainment system connect with a common power node 100A, default mode operation allows one of the components to function as a master for turning slave components on and off.

In various embodiments, a processor in signal communication with the power node I/O block 210 infers the nature of the load 121 by analyzing data available from the power node 100A. The method for inferring the nature of the load is referred to herein as Basic Analysis.

FIG. 7 shows output data derived from the power node power analyzer 208, the insertion switch 306, and the dial selector 216. The figure also shows output data used by each of the analytical tools.

Basic analysis uses power clues and contextual information to identify likely device classes for a load, typically a home appliance. As shown in FIG. 7, basic analysis considers standby and operational power consumption, power factor, and peak versus RMS current. In addition, one or more environmental factors including room location, neighbor appliances (in the same room), time of use, and type of power node (single outlet or multiple outlet) are considered.

In basic analysis, load assessment typically utilizes a few data snapshots. For example, an appliance requiring 10 watts standby power and 200 watts operational power is located in a family room. These data fit the profile of a television and assuming no contra indication from the power factor and peak versus RMS currents, this load would likely be matched with a television.

Data for matching loads to appliances is in various embodiments maintained in storage accessible to the local network 107 or the external network 193. Local data storage devices include the gateway host 108 and the user device 110. External data storage devices include storage devices such as semiconductor and hard disc storage located in the datacenter 194.

Once an outlet/load is matched to a particular appliance, there is no need to run the matching process again unless the appliance is unplugged. In various embodiments, the plug insertion switch 306 sets a flag when a plug is inserted in a respective outlet 206. A set flag results in the load assessment being run for the indicated outlet/load; once the assessment runs, the flag is cleared. With respect to a particular socket, removal of a plug and reinsertion of a plug resets the flag and causes the matching process to execute again.

As discussed above, information is transmitted over the local network 107 and over the external network 193. In an embodiment, network information exchanges include transmission of one or more network messages such as one or more of:
  a) waveform profiles;
  b) change detection system (CDS) filter profile;
  c) meter report;
  d) overcurrent alert; and,
  e) instantaneous power.

Figure 8:
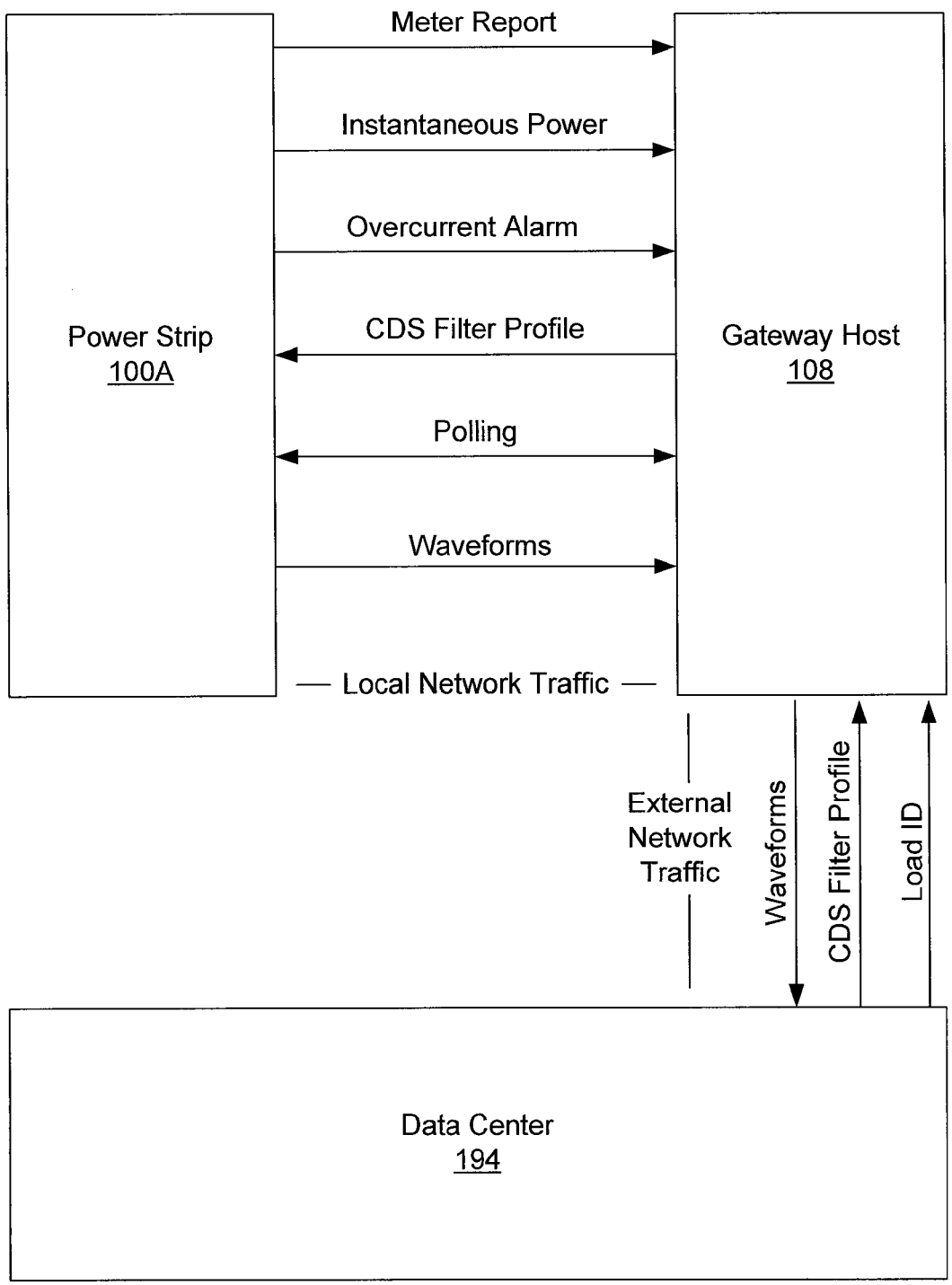
FIG. 8 shows a first view of messages associated with the energy management system of FIG. 1B.

FIG. 8 shows messages exchanged on the local and external networks 800. On the local network 107, messages are exchanged between power strip 100A and the gateway host 108. The power strip 100A transmits meter report, instantaneous power, instantaneous voltage/voltage waveform profile, instantaneous current/current waveform profile, and overcurrent alarm to the gateway host 108. In some embodiments (see below), the gateway host transmits change detection system filter ("CDS") profiles to the gateway host.

In some embodiments, either of the power strip 100A or the gateway host 108 polls the other device to obtain information. For example, the gateway host might poll the power strip, requesting a meter report. In response to the polling request, the power strip would send the meter report to the gateway host.

On the external network 193, messages are exchanged between the network 107 and/or the data center 194. The gateway host transmits waveform profiles to the data center and the data center transmits appliance identifications and matched CDS filter profiles to the gateway host.

FIG. 9 shows how the messages are used. Instantaneous power shows instantaneous consumption. Meter reports integrate instantaneous power over time to provide power consumption during particular time periods. Waveform profiles show how voltage and current vary with time; notably, waveform profiles are, as discussed above, available for each outlet/load 206/121. Overcurrent alarms provide a warning that a current rating and/or capacity of the power strip 100A has been exceeded. A change detection system ("CDS") profile provides filter parameters for a single socket/load. CDS filter parameters include any of voltage, current, power, insertion switch state, temperature, and metrics based on these parameters.

As mentioned above, one device may poll another device to obtain information. Another alternative is automatic reporting triggered by a changed state. In this embodiment, the processor 212 includes a change detection system 311 that monitors one or more variables such as power, current, and voltage. A change in the variable being monitored that exceeds a threshold value triggers automatic reporting. For example, if a threshold power change of 10 watts is set, a load change from 195 to 200 watts would not be reported by the CDS; but, a load change from 195 to 205 watts would be reported.

From the above, it can be seen that use of CDS triggered reporting rather than polling offers a means to reduce network traffic. Traffic is reduced because only exceptional events are reported over the network. Criteria for defining exceptional events are defined in CDS filter profiles. The filter profile to be applied to a particular socket/load 206/121 is selected when waveform data sent to the data center is matched with a particular appliance. For example, if load waveform data sent to the datacenter is matched with a television known to consume 10 watts in standby and 200 watts in operation, the CDS filter profile might ignore spurious/uninteresting load changes below 10 watts.

Reporting can also be triggered based on elapsed time. For example, instantaneous power might be reported automatically every 2 seconds. In an embodiment, reporting is based on a hybrid system including multiple reporting systems. For example, any plurality of time triggered reporting, CDS triggered reporting, and polling are used together.

Figure 10:
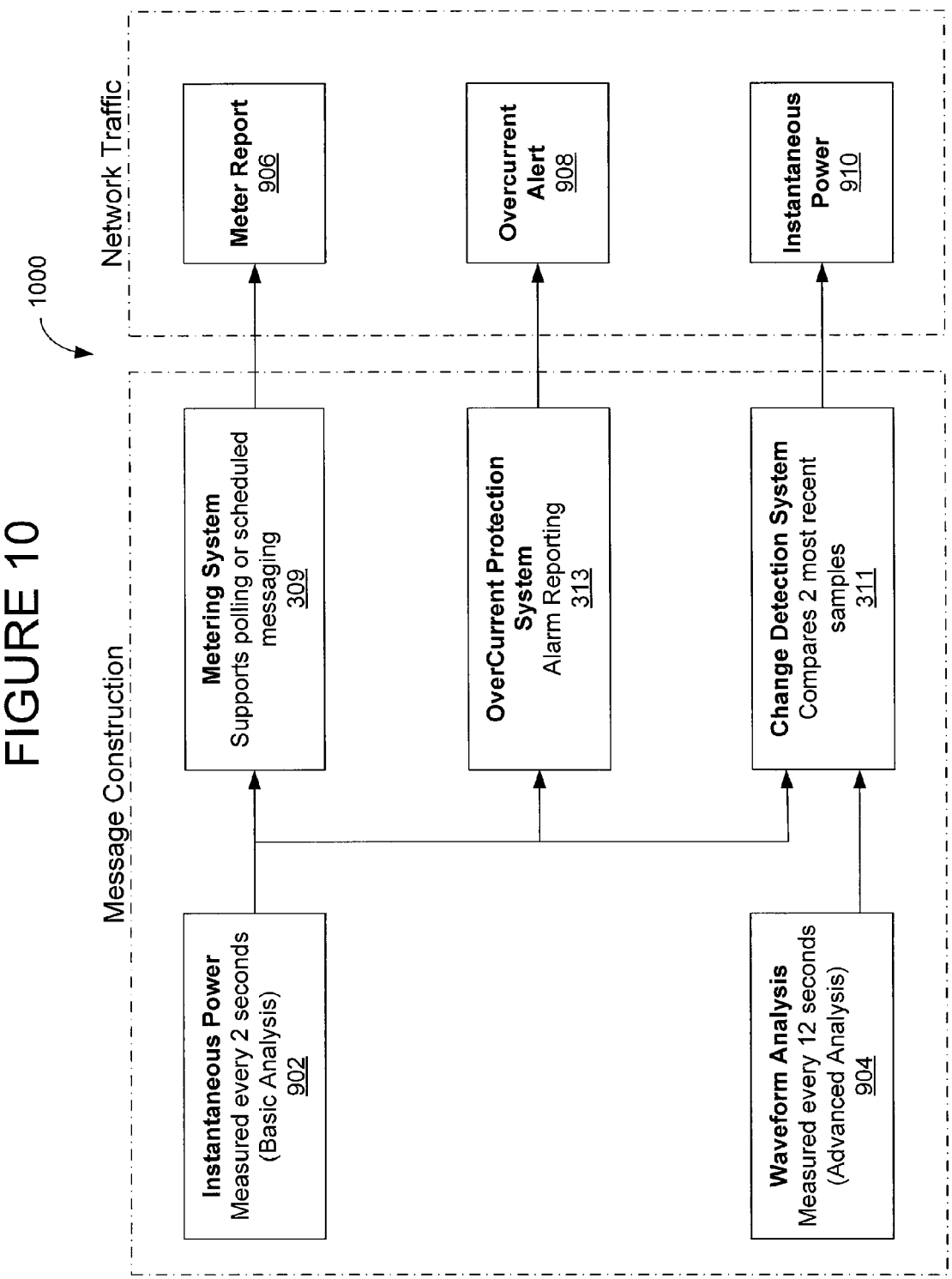
FIG. 10 shows a second view of messages associated with the energy management system of FIG. 1B.

FIG. 10 shows an embodiment with polled, timed, event, and CDS reporting 1000. Instantaneous power is measured every 2 seconds 902 and sent to a metering system 309, an over current protection system 313, and a change detection system 311. Metering reports 906 from the metering system 309 are triggered based on polling or scheduled messaging. Over current alerts 908 from the over current protection system 313 are triggered when an over current event occurs. Instantaneous power reports 910 from the change detection system 311 are triggered when a change in instantaneous power exceeds a predetermined threshold value.

In addition to the uses mentioned above, embodiments of the power node for energy management of the present invention 100A include informing users of individual appliance power consumption, enabling control of individual outlets to, inter alia, interrupt appliance standby power flows, and managing or lowering one or both of energy consumption and energy cost.

In one commercial embodiment, a consumer kit includes a plurality of multi and single socket power nodes 100A, a gateway 108, and a controller or user device 110. During manufacture and testing, these devices are preconfigured with identification codes allowing interoperation. The controller is also preprogrammed with home, night and away selections. The home selection enables all of the power node sockets 206 by closing the respective power switches 204. The night selection enables the default mode of multi socket power nodes and disables single socket power nodes. The away selection disables all of the power node sockets.

While various embodiments of the present invention have been described above, it should be understood that they have been presented by way of example only, and not limitation. It will be apparent to those skilled in the art that various changes in the form and details can be made without departing from the spirit and scope of the invention. As such, the breadth and scope of the present invention should not be limited by the above-described exemplary embodiments, but should be defined only in accordance with the following claims and equivalents thereof.

What is claimed is:

1. A power node for energy management comprising:
an input power coupler;
a first power switch having a first control port, a first power terminal and a second power terminal, the first power terminal electrically connected to the input power coupler, the first control port configured to control an electrical connection between the first power terminal and the second power terminal;
a first socket electrically connected to the second terminal of the first power switch;
a voltage sensor operable to measure voltage at the first socket;
a first current sensor operable to measure current flowing through the first socket;
a selector device configured to provide an environmental variable from a plurality of selectable environmental variables;
a signal electronics section including a communications block configured to communicate over a network, the signal communications block in signal communication with the selector device, the first control port of the first power switch, the voltage sensor and the first current sensor;
the signal electronics section configured to
monitor said current flowing through the first socket,
monitor said voltage at the first socket,
control said electrical connection between the first power terminal and the second power terminal of the first power switch, and
communicate across a network via the communications block;
a housing physically coupling the first socket, the first power switch, the signal electronics section, the first current sensor and the voltage sensor.

2. The power node of claim 1, the input power coupler comprising:
a power cord extending from the housing;

the power cord having a first end and a second end, the first end terminated with a power plug and the second end electrically connected to the first power terminal of the first switch, the power cord operable to conduct electricity from the power plug to the first power terminal of the first switch.

3. The power node of claim 1, the input power coupler comprising:
a power plug extending from the housing, wherein the power plug is electrically coupled to the first power terminal of the first switch and operable to conduct electricity from the power plug to the first power terminal of the first switch.

4. The power node of claim 1 further comprising:
a temperature sensor physically coupled to the housing and in signal communication with the signal electronics section; wherein
the signal electronics section is further configured to monitor an air temperature near the power node.

5. The power node of claim 1 further comprising:
a first insertion switch having an electrical state indicating whether a device plug is inserted in the first socket, the first insertion switch physically coupled to the housing and in signal communication with the signal electronics section; wherein
the signal electronics section is further configured to monitor the electrical state of the first insertion switch.

6. The power node of claim 1 wherein the signal electronics section is further configured to:
compare said current supplied to the first socket to a predetermined safe maximum; and
control the first power switch to electrically disconnect the first power terminal from the second power terminal of the first power switch if said current supplied to the first socket exceeds the predetermined safe maximum.

7. The power node of claim 1 wherein the signal electronics section is further configured to send a message across the network, said message containing information based on a measured value of said current supplied to the first socket.

8. The power node of claim 1 wherein the signal electronics section is further configured to:
receive a command from across the network;
control said electrical connection between the first power terminal and the second power terminal of the first power switch based on the command from across the network.

9. The power node of claim 1 further comprising:
a second power switch having a second control port, a third power terminal and a fourth power terminal, the third power terminal electrically connected to the input power coupler, the second control port in signal communication with the signal electronics section and operable to control an electrical connection between the third power terminal and the fourth power terminal;
a second socket electrically connected to the fourth terminal of the second power switch;
a second current sensor in signal communication with the signal electronics section and operable to measure current flowing through the second socket;
the signal electronics section further operable to
monitor said current flowing through the second socket, and
control said electrical connection between the third power terminal and the fourth power terminal of the second power switch;
the housing further physically coupling the second socket, second first power switch, and the second current sensor.

10. An energy management system comprising:
one or more of the power nodes of claim 1, including a particular power node;
a user device in signal communication with the network, wherein the user device is operable to characterize a load plugged into the first socket of the particular power node based on one or more electrical measurements related to the first socket of the particular power node.

11. The energy management system of claim 10 wherein the characterization of said load is also based on said environmental variable of the particular power node.

12. The energy management system of claim 10 wherein the user device is further operable to control the first power switch of the particular power node.

13. The energy management system of claim 10 wherein the user device is further operable to report energy consumed by one or more appliances plugged into the one or more power nodes.

14. The energy management system of claim 13 wherein the user device is further operable to report a cost related to the energy consumed by the one or more appliances plugged into the one or more power nodes.

15. The energy management system of claim 10 further comprising:
a change detection system; and
a change detection system filter having one or more filter parameters;
wherein the power node transmits a network message when a filter parameter of the one or more filter parameters differs from a corresponding value derived from said one or more electrical measurements related to the first socket of the particular power node by a predetermined amount.

16. A method of managing energy consumption comprising:
interposing one or more power nodes of claim 1 in one or more power circuits supplying one or more appliances with electric power;
measuring energy consumption of at least one electric appliance of the one or more appliances;
displaying opportunities for reducing energy consumption, said opportunities being identified based on measurements of said energy consumption; and,
managing energy consumption by providing automated means to remotely control said energy consumption.

17. The method of claim 16 further comprising:
identifying a standby power consumption of an appliance of the plurality of appliances; and,
disconnecting said appliance from said electric power if said appliance remains in a standby mode for a time greater than a predetermined period of time.

* * * * *